(12) United States Patent
Sugimae et al.

(10) Patent No.: US 9,245,928 B2
(45) Date of Patent: Jan. 26, 2016

(54) NON-VOLATILE MEMORY DEVICE

(71) Applicant: Kabushiki Kaisha Toshiba, Minato-ku (JP)

(72) Inventors: Kikuko Sugimae, Kuwana (JP); Kiyohito Nishihara, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/461,847

(22) Filed: Aug. 18, 2014

(65) Prior Publication Data

US 2015/0255508 A1    Sep. 10, 2015

Related U.S. Application Data

(60) Provisional application No. 61/950,444, filed on Mar. 10, 2014.

(51) Int. Cl.
*H01L 21/4763*    (2006.01)
*H01L 27/24*    (2006.01)
*H01L 45/00*    (2006.01)

(52) U.S. Cl.
CPC ............ *H01L 27/249* (2013.01); *H01L 45/085* (2013.01); *H01L 45/1233* (2013.01)

(58) Field of Classification Search
None
See application file for complete search history.

(56) References Cited

U.S. PATENT DOCUMENTS

| | | | |
|---|---|---|---|
| 8,431,921 B2 | 4/2013 | Pickett | |
| 8,476,613 B2 | 7/2013 | Liu | |
| 2011/0031465 A1 | 2/2011 | Mitani et al. | |
| 2014/0319442 A1* | 10/2014 | Hayashi | H01L 45/12 257/2 |

* cited by examiner

*Primary Examiner* — Angel Roman
(74) *Attorney, Agent, or Firm* — Oblon, McClelland, Maier & Neustadt, L.L.P.

(57) ABSTRACT

According to an embodiment, a nonvolatile memory device includes: a first interconnection layer extending in a first direction; a second interconnection layer extending in a second direction crossing the first direction, the second interconnection layer including a metal-containing layer and a metal ion source layer, and the metal ion source layer being provided on the first interconnection layer side; and a resistance change layer provided in a position where the first interconnection layer and the second interconnection layer cross each other and a metal ion released from the metal ion source layer being capable to be diffused into the resistance change layer. At least part of the second interconnection layer protrudes to the first interconnection layer side in a cross section of the second interconnection layer cut perpendicularly to the second direction.

18 Claims, 6 Drawing Sheets

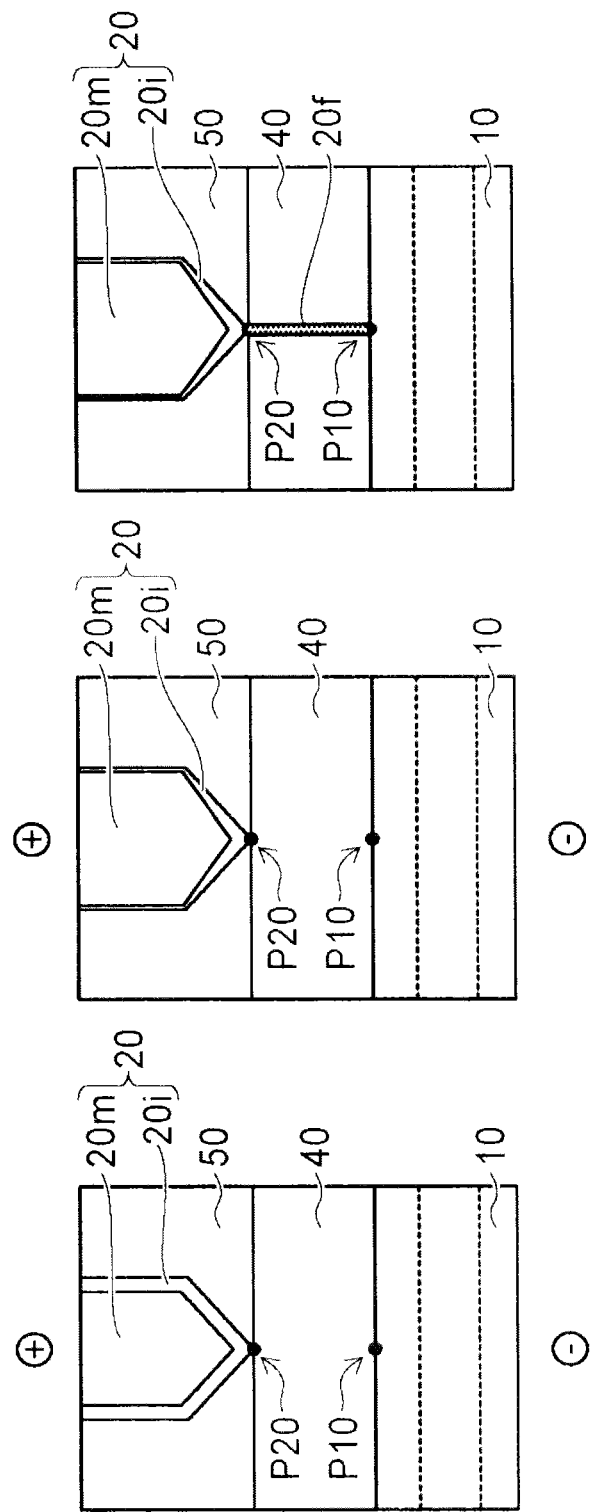

NON-VOLATILE MEMORY DEVICE

CROSS-REFERENCE TO RELATED APPLICATIONS

This application is based upon and claims the benefit of priority from U.S. Provisional Patent Application 61/950,444, filed on Mar. 10, 2014; the entire contents of which are incorporated herein by reference.

FIELD

Embodiments described herein relate generally to a nonvolatile memory device.

BACKGROUND

With the increasing integration degree of semiconductor devices, circuit patterns of LSI elements are becoming finer. To make the pattern finer, it is required not only to reduce the line width but also to improve the dimensional accuracy and positional accuracy of the pattern. Also for memory devices, it is required to retain a certain amount of charge necessary for memory in a smaller region in a minute cell.

As a technology to overcome such a problem, there is a nonvolatile memory device in which a memory cell is formed using a resistance change layer. The nonvolatile memory device has a three-dimensionally stacked structure, and can therefore increase the integration degree as compared to memory cells utilizing a two-dimensional plane. As the integration degree is increased, higher reliability is required for the write operation.

BRIEF DESCRIPTION OF THE DRAWINGS

FIG. 3A to FIG. 3C are schematic cross-sectional views showing operations of the nonvolatile memory device according to the first embodiment;

DETAILED DESCRIPTION

Figure 1:
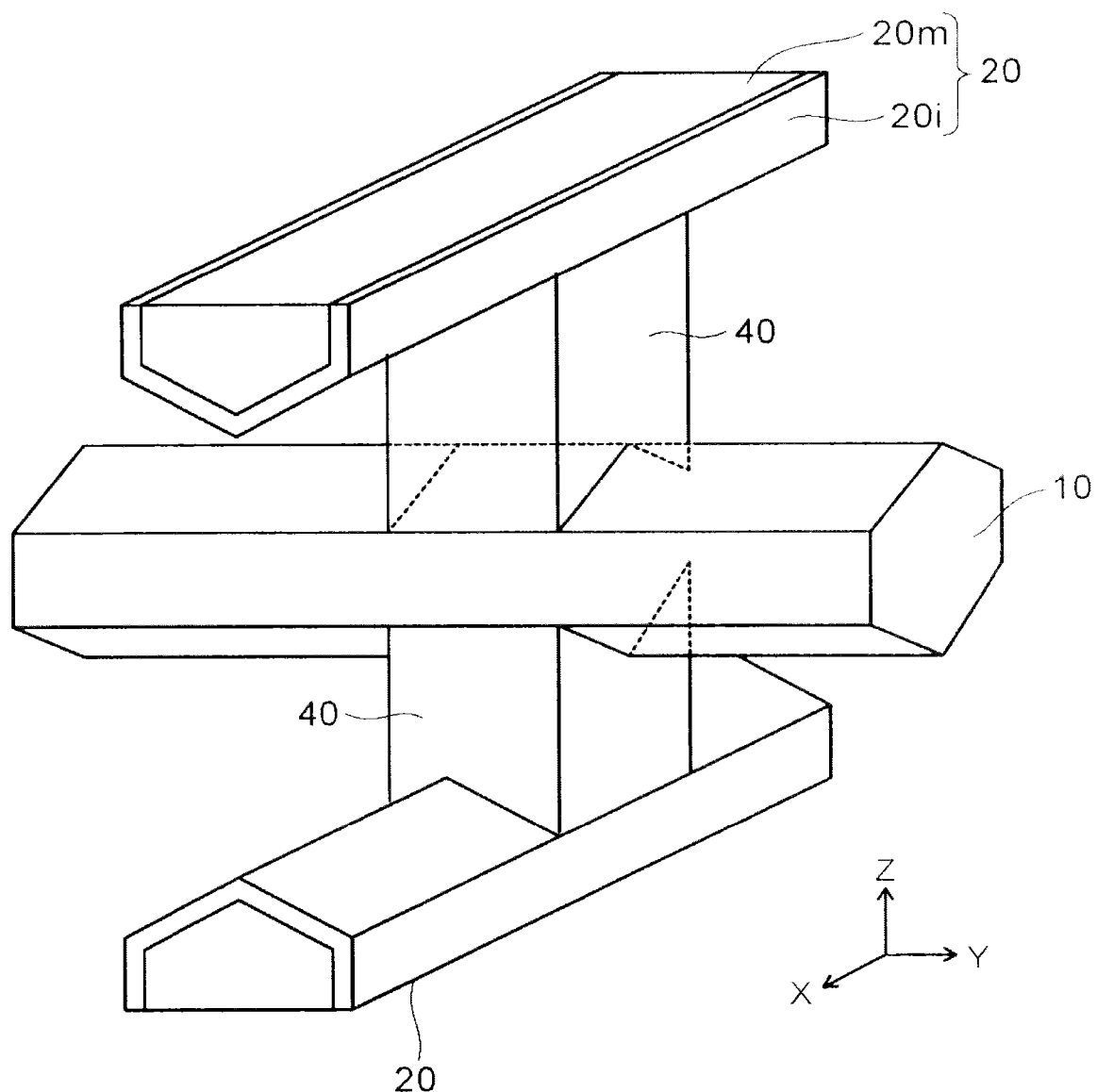
FIG. 1 is a schematic perspective view showing a nonvolatile memory device according to a first embodiment.

According to an embodiment, a nonvolatile memory device includes: a first interconnection layer extending in a first direction; a second interconnection layer extending in a second direction crossing the first direction, the second interconnection layer including a metal-containing layer and a metal ion source layer, and the metal ion source layer being provided on the first interconnection layer side; and a resistance change layer provided in a position where the first interconnection layer and the second interconnection layer cross each other and a metal ion released from the metal ion source layer being capable to be diffused into the resistance change layer. At least part of the second interconnection layer protrudes to the first interconnection layer side in a cross section of the second interconnection layer cut perpendicularly to the second direction.

Hereinbelow, embodiments are described with reference to the drawings. In the following description, identical components are marked with the same reference numerals, and a description of components once described is omitted as appropriate.

First Embodiment

FIG. 1 is a schematic perspective view showing a nonvolatile memory device according to a first embodiment.

Figure 2A:
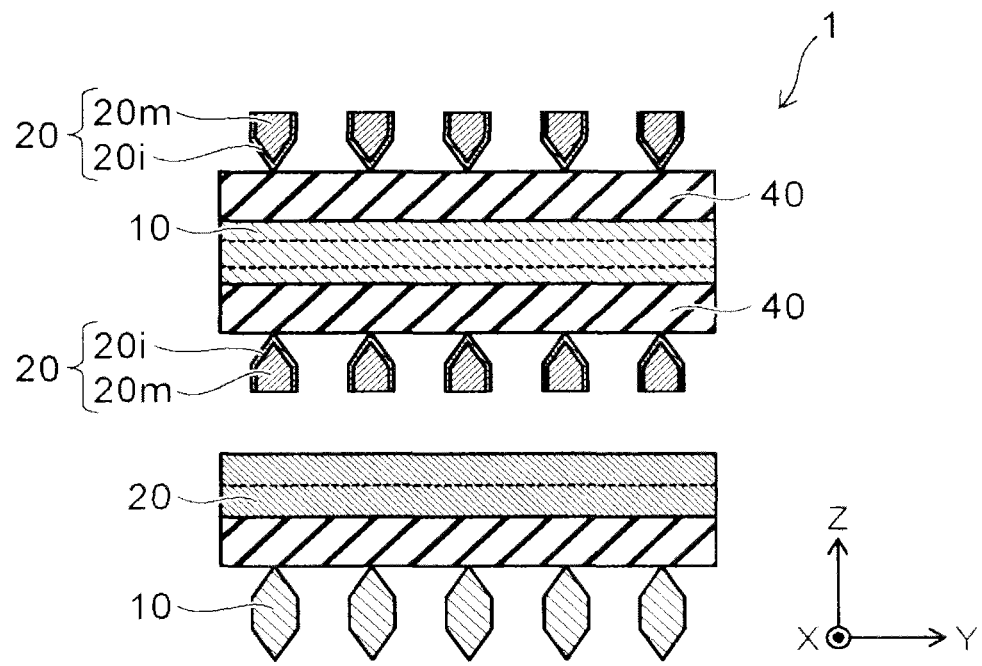
FIG. 2A and FIG. 2B are schematic cross-sectional views showing the nonvolatile memory device according to the first embodiment.
Figure 2B:
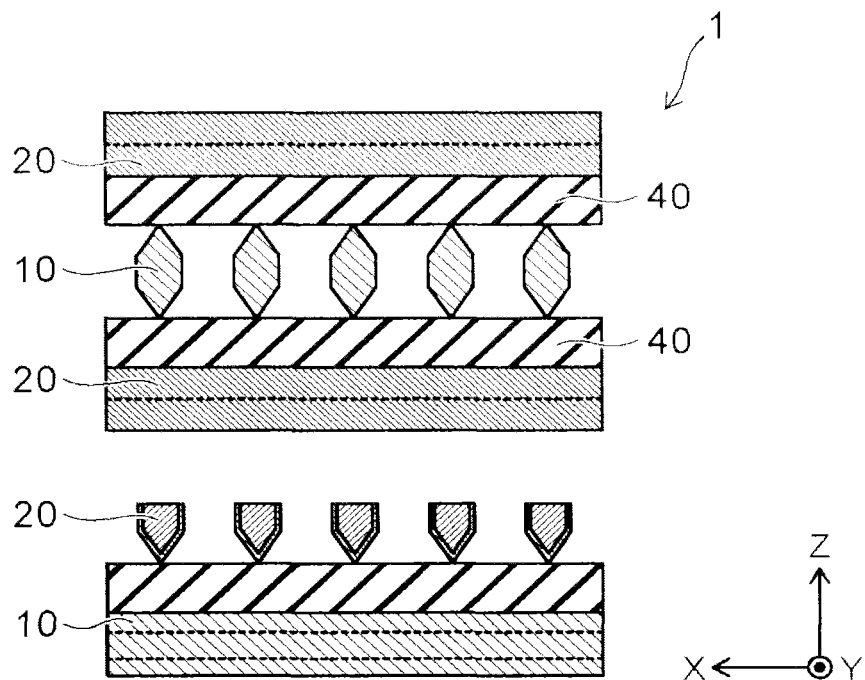

FIG. 2A and FIG. 2B are schematic cross-sectional views showing the nonvolatile memory device according to the first embodiment.

A nonvolatile memory device 1 according to the first embodiment includes an interconnection layer 10 (a first interconnection layer), an interconnection layer 20 (a second interconnection layer), and a resistance change layer 40 (a first resistance change layer).

Here, the interconnection layer 10 extends in the Y-direction (a first direction). The interconnection layer 10 includes a metal such as tungsten (W). The interconnection layer 10 may include a metal nitride in addition to tungsten or the like. The interconnection layer 10 may be a stacked structure of a layer including a metal such as tungsten and a layer containing a metal nitride. The interconnection layer 20 extends in the X-direction (a second direction) crossing the Y-direction. The interconnection layer 20 includes a metal-containing layer 20$m$ and a metal ion source layer 20$i$. The metal-containing layer 20$m$ includes a metal such as tungsten (W). The metal ion source layer 20$i$ includes at least one of Au, Ag, Pd, Ir, Pt, W, Hf, Zr, Ti, Ni, Co, Al, Cr, Cu, and the like. The metal ion source layer 20$i$ is provided on the interconnection layer 10 side. The metal ion source layer 20$i$ is provided between the resistance change layer 40 and the metal-containing layer 20$m$.

In the nonvolatile memory device 1, a group of a plurality of interconnection layers 10 and a group of a plurality of interconnection layers 20 are arranged in the Z-direction. In the first embodiment, a group including the interconnection layer 10, the interconnection layer 20, and the resistance change layer 40 is referred to as a memory element. One of the interconnection layer 10 and the interconnection layer 20 is a bit line, and the other is a word line.

In the nonvolatile memory device 1, when a cross section of the interconnection layer 20 cut perpendicularly to the X-direction is viewed, at least part of the interconnection layer 20 protrudes to the interconnection layer 10 side. A portion of the interconnection layer 20 protruding to the interconnection layer 10 side is the metal ion source layer 20$i$. The cross section of the interconnection layer 20 is a polygon, and a corner of the polygon protrudes to the interconnection layer 10 side, for example.

When a cross section of the interconnection layer 10 cut perpendicularly to the Y-direction is viewed, at least part of the interconnection layer 10 protrudes to the interconnection layer 20 side. A portion of the interconnection layer 10 protruding to the interconnection layer 20 side may be a metal ion source layer. The cross section of the interconnection layer 10 is a polygon, and a corner of the polygon protrudes to the interconnection layer 20 side.

The resistance change layer 40 is provided in a position where the interconnection layer 10 and the interconnection layer 20 cross each other. In the position where the interconnection layer 10 and the interconnection 20 cross each other, a portion of the interconnection layer 10 protruding to the interconnection layer 20 side and a portion of the interconnection layer 20 protruding to the interconnection layer 10 side form the shortest distance via the resistance change layer 40. The resistance change layer 40 is a layer that allows metal ions released from the metal ion source layer 20i to be diffused into the resistance change layer 40.

The resistance change layer 40 is a layer including silicon, oxygen, a metal, or others. For example, the resistance change layer 40 includes silicon oxide ($SiO_x$), polysilicon, alumina, hafnia, or the like. The resistance change layer 40 may be a stacked body in which one of a silicon oxide film, a polysilicon film, an alumina film, and a hafnia film is combined. The layer including such a material is the matrix of the resistance change layer 40.

The resistance of the resistance change layer 40 can be changed by diffusing metal ions released from the metal ion source layer 20i into the matrix or returning the diffused metal ions to the metal ion source layer 20i.

Thereby, the resistance of the resistance change layer 40 reversibly becomes the low resistance state (data: 1) or the high resistance state (data: 0). In the embodiment, making the resistance of the resistance change layer 40 the low resistance state is referred to as a set operation, and making the resistance of the resistance change layer 40 the high resistance state is referred to as a reset operation.

An interlayer insulating film (not shown) is provided between adjacent interconnection layers 10, between adjacent interconnection layers 20, and between the interconnection layer 10 and the interconnection layer 20.

Operations of the nonvolatile memory device 1 will now be described.

The matrix of the resistance change layer 40 needs a certain level of thickness (for example, several nanometers or more) in order to suppress OFF current. On the other hand, the set voltage tends to increase as the thickness of the matrix increases. The nonvolatile memory device 1 ensures an enough thickness of the resistance change layer 40 to suppress OFF current, and has a structure to prevent the increase in set voltage.

FIG. 3A to FIG. 3C are schematic cross-sectional views showing operations of the nonvolatile memory device according to the first embodiment.

FIG. 3A to FIG. 3C show an example of the operation of the nonvolatile memory device, and the embodiment is not limited to the operation shown in the drawings.

First, as shown in FIG. 3A, a prescribed voltage is applied between the interconnection layer 10 and the interconnection layer 20. Herein, a high electric potential is applied to the interconnection layer 20 with respect to the interconnection layer 10. Point P10 and point P20 in the drawing are the positions of the tips of both interconnection layers. The distance between the interconnection layer 10 and the interconnection layer 20 is shortest between point P10 and point P20. Therefore, when a voltage is applied between the interconnection layer 10 and the interconnection layer 20, it is likely that the electric field will concentrate between point P10 and point P20.

Subsequently, when the prescribed voltage is continued to be applied between the interconnections, metal in the metal ion source layer 20i is attracted to the negative electrode side (the interconnection layer 10 side) and migration of metal ions (for example, Ag ions) occurs in the metal ion source layer 20i, as shown in FIG. 3B. Thereby, metal ions concentrate near point P20.

Subsequently, when the prescribed voltage is continued to be applied between the interconnection layers, metal ions are released to the resistance change layer 40 side to form a filament 20f including the metal ions, as shown in FIG. 3C. The filament 20f is likely to be formed between point P10 and point P20 where the electric field is concentrated. In other words, the filament 20f is formed in a position where the interconnection layer 10 and the interconnection layer 20 cross each other, that is, at the center or almost at the center of the memory element (hereinafter, a central portion). The electric field concentration between point P10 and point P20 serves as a trigger for forming the filament.

When the voltage is applied and the lower end of the filament 20f has come into contact with the interconnection layer 10, the resistance of the memory element transitions from the high resistance state "0" to the low resistance state "1", and the writing of data is performed on the memory element. This operation is referred to as a set operation. The voltage when the set operation is performed is referred to as a set voltage, and the current flowing through the memory element during set voltage application is referred to as a set current. The state of the memory element after the set operation may be referred to as a set state.

When a low electric potential is applied to the interconnection layer 20 with respect to the interconnection layer 10, metal ions return from the resistance change layer 40 to the metal ion source layer 20i side, and the lower end of the filament 20f moves away from the interconnection layer 10. In other words, the filament 20f and the interconnection layer 10 become non-contact. Thereby, the resistance of the memory element transitions from the low resistance state "1" to the high resistance state "0", and the data written in the memory element are erased. This operation is referred to as a reset operation. The state of the memory element after the reset operation may be referred to as a reset state.

Here, a case is assumed where the interconnection layer 10 and the interconnection layer 20 are parallel flat plates.

If the interconnection layer 10 and the interconnection layer 20 are parallel flat plates, the filament 20f is not necessarily formed in the central portion of the memory element. Consequently, the set voltage or the reset voltage may not be stable as compared to the first embodiment.

In contrast, in the nonvolatile memory device 1, both the interconnection layer 10 and the interconnection layer 20 have a protruding portion, and oppose their tips (point P10 and point P20) to each other. Thereby, the filament 20f is formed selectively in the central portion of the memory element. Thus, the position where the filament 20f is formed is always the same position, and the set voltage and the reset voltage are stabilized. In other words, the variation in set voltage and reset voltage is suppressed.

In the nonvolatile memory device 1, the electric field is concentrated between point P10 and point P20 during the set operation or the reset operation. Therefore, in the nonvolatile memory device 1, the set voltage and the reset voltage can be set low as compared to the parallel flat plates type.

FIG. 4A to FIG. 4D are schematic cross-sectional views showing an example of the manufacturing process of the nonvolatile memory device according to the first embodiment.

Figure 4A:
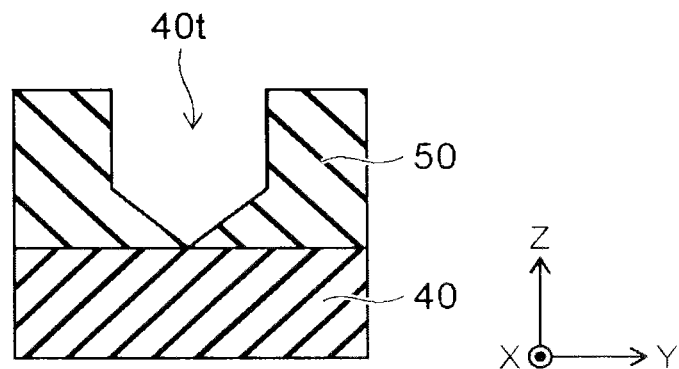
FIG. 4A to FIG. 4D are schematic cross-sectional views showing an example of the manufacturing process of the nonvolatile memory device according to the first embodiment.

First, as shown in FIG. 4A, a trench 40t is formed in an interlayer insulating film 50 formed on the resistance change layer 40. The etching conditions for the trench 40t are appropriately selected, so that a lower portion of the trench 40t protrudes to the resistance change layer 40 side when a cross section of the trench 40t cut perpendicularly to the X-direction is viewed, for example.

Figure 4B:
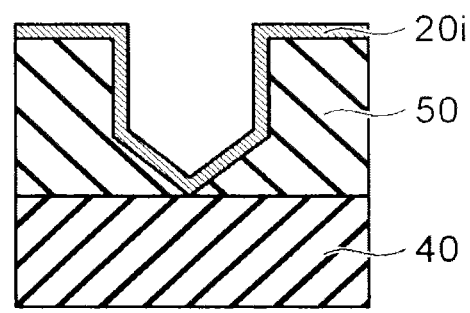

Next, as shown in FIG. 4B, the metal ion source layer 20i is formed on the inner wall of the trench 40t and on the interlayer insulating film 50 by a method such as CVD (chemical vapor deposition) and sputtering. After that, the metal ion source layer 20i formed on the interlayer insulating film 50 is removed by CMP (chemical mechanical polishing) or the like, for example.

Figure 4C:
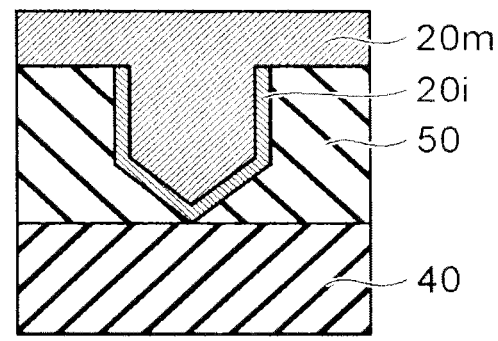

Next, as shown in FIG. 4C, the metal-containing layer 20m is formed on the metal ion source layer 20i and on the interlayer insulating film 50 by a method such as CVD, sputtering, and plating.

Figure 4D:
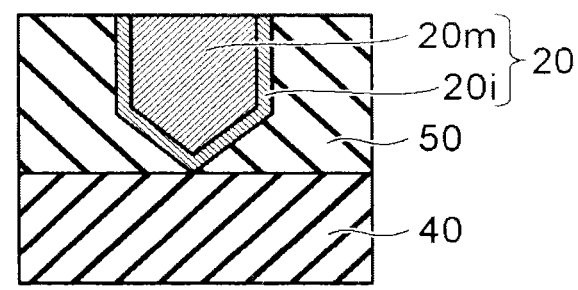

Next, as shown in FIG. 4D, the metal-containing layer 20m on the upper side of the interlayer insulating film 50 is removed by CMP or the like. By such a manufacturing process, the nonvolatile memory device 1 is formed.

Second Embodiment

Figure 5A:
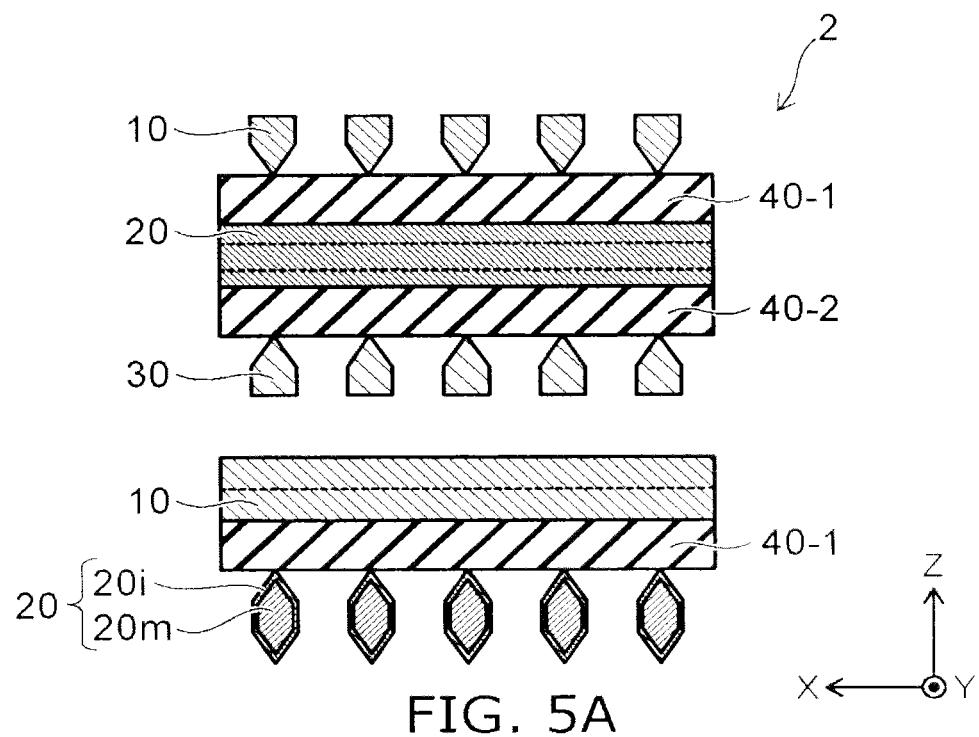
FIG. 5A and FIG. 5B are schematic cross-sectional views showing a nonvolatile memory device according to a second embodiment.
Figure 5B:
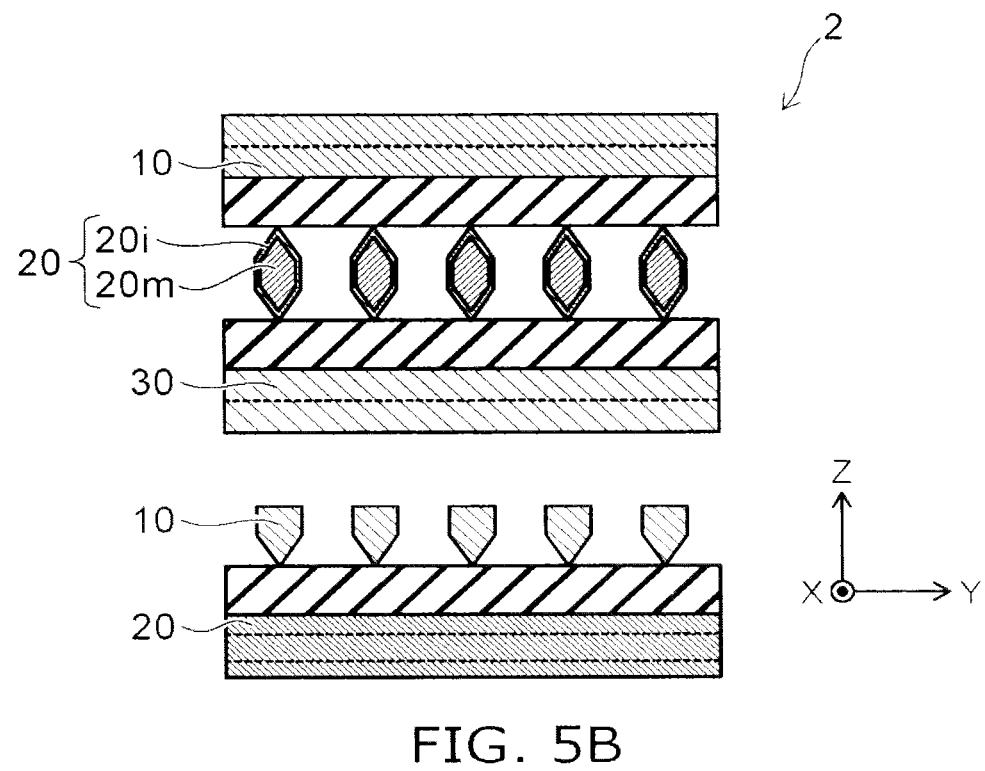

FIG. 5A and FIG. 5B are schematic cross-sectional views showing a nonvolatile memory device according to a second embodiment.

In a nonvolatile memory device 2, the interconnection layer 10 extends in the Y-direction. When a cross section of the interconnection layer 10 is viewed, at least part of the interconnection layer 10 protrudes to the interconnection layer 20 side. The cross section of the interconnection layer is a polygon, and a corner of the polygon protrudes to the interconnection layer 20 side.

The interconnection layer 20 extends in the X-direction. The interconnection layer 20 includes the metal-containing layer 20m and the metal ion source layer 20i.

An interconnection layer 30 (a third interconnection layer) crosses the interconnection layer 20, and extends in the Y-direction. The interconnection layer 30 is provided on the opposite side to the interconnection layer 10. When a cross section of the interconnection layer 30 cut perpendicularly to the Y-direction is viewed, at least part of the interconnection layer 30 protrudes to the interconnection layer 20 side. The cross section of the interconnection layer 30 is a polygon, and a corner of the polygon protrudes to the interconnection layer 20 side.

A resistance change layer 40-1 is provided in a position where the interconnection layer 20 and the interconnection layer 10 cross each other. A resistance change layer 40-2 is provided in a position where the interconnection layer 20 and the interconnection layer 30 cross each other. The resistance change layers 40-1 and 40-2 are layers that allow metal ions released from the metal ion source layer 20i to be diffused into the resistance change layers 40-1 and 40-2, respectively.

The metal ion source layer 20i of the interconnection layer 20 is provided on the interconnection layer 10 side and on the interconnection layer 30 side. When a cross section of the interconnection layer 20 is viewed, at least parts of the interconnection layer 20 protrude to the interconnection layer 10 side and to the interconnection layer 30 side. The cross section of the interconnection layer 20 is a polygon, and corners of the polygon protrude to the interconnection layer 10 side and to the interconnection layer 30 side. The metal ion source layer 20i is provided between the resistance change layer 40-1 and the metal-containing layer 20m and between the resistance change layer 40-2 and the metal-containing layer 20m.

Thus, portions of the interconnection layer 20 protruding to the interconnection layer 10 side and to the interconnection layer 30 side are the metal ion source layer 20i. In a position where the interconnection layer 10 and the interconnection layer 20 cross each other, a portion of the interconnection layer 10 protruding to the interconnection layer 20 side and a portion of the interconnection layer 20 protruding to the interconnection layer 10 side form the shortest distance via the resistance change layer 40-1. In a position where the interconnection layer 30 and the interconnection layer 20 cross each other, a potion of the interconnection layer 30 protruding to the interconnection layer 20 side and a portion of the interconnection layer 20 protruding to the interconnection layer 30 side form the shortest distance via the resistance change layer 40-2.

By the nonvolatile memory device 2, the filament 20f can be formed from one interconnection layer 20 toward both of the interconnection layers 10 and 30 provided on the upper and lower sides of the one interconnection layer 20.

Third Embodiment

Figure 6A:
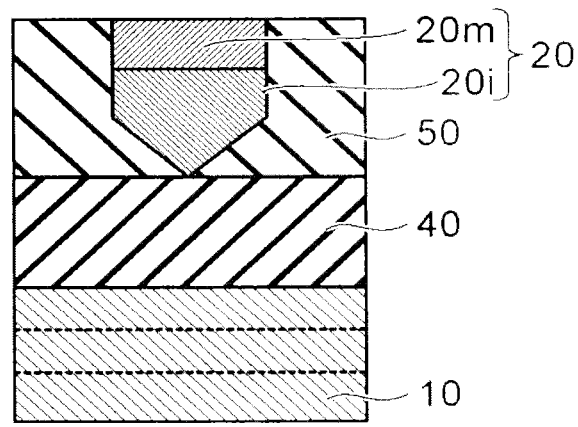
FIG. 6A to FIG. 6C are schematic cross-sectional views showing nonvolatile memory devices according to a third embodiment.
Figure 6B:
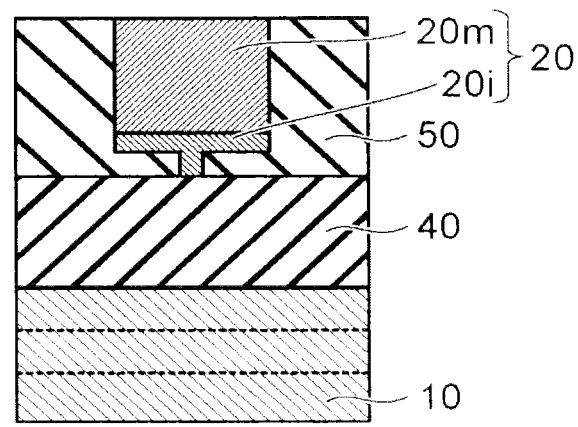
Figure 6C:
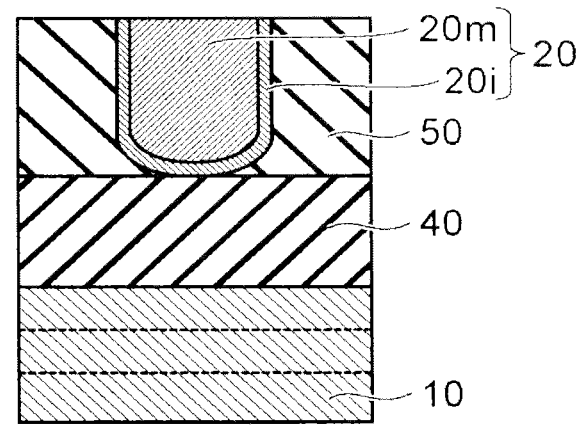

FIG. 6A to FIG. 6C are schematic cross-sectional views showing nonvolatile memory devices according to a third embodiment.

The cross-sectional structure of the interconnection layer 20 is not limited to the examples described above.

For example, as shown in FIG. 6A, the cross section of the interconnection layer 20 may be a polygon, and the interconnection layer 20 may have a stacked structure in which the lower side forms the metal ion source layer 20i and the upper side forms the metal-containing layer 20m.

Furthermore, as shown in FIG. 6B, the interconnection layer 20 may include the metal ion source layer 20i and the metal-containing layer 20m, and a protrusion 20t may be provided in the metal ion source layer 20i.

Furthermore, as shown in FIG. 6C, the portion where the interconnection layer 20 protrudes to the interconnection layer 10 side may not be a corner of a polygon but be a curved surface.

Also in these memory elements, the electric field is concentrated in the central portion of the memory element during the set operation or the reset operation. Therefore, the third embodiment exhibits similar effects to the first embodiment.

In order that in the set operation a current may not flow excessively between the interconnection layer 10 and the interconnection layer 20, a current limitation layer (not shown) may be provided between the interconnection layer 10 and the interconnection layer 20. In other words, a current limitation layer may be provided in a position where the interconnection layer 10 and the interconnection layer 20 cross each other. A current limitation layer may be provided in a position where the interconnection layer 10 and the interconnection layer 20 cross each other and in a position where the interconnection layer 30 and the interconnection layer 20 cross each other.

In the embodiments described above, the term "on" in "a portion A is provided on a portion B" may refer to not only the case where the portion A is provided on the portion B such that the portion A is in contact with the portion B but also the case where the portion A is provided above the portion B such that the portion A is not in contact with the portion B. Furthermore, "a portion A is provided on a portion B" may refer to the case where the portion A and the portion B are inverted and the portion A is located below the portion B and the case where the portion A and the portion B are laterally juxtaposed. This is because, even when the semiconductor device according to the embodiment is rotated, the structure of the semiconductor device is not changed by the rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
   a first interconnection layer extending in a first direction;
   a second interconnection layer extending in a second direction crossing the first direction, the second interconnection layer including a metal-containing layer and a metal ion source layer, and the metal ion source layer being provided on the first interconnection layer side; and
   a resistance change layer provided in a position where the first interconnection layer and the second interconnection layer cross each other and a metal ion released from the metal ion source layer being capable to be diffused into the resistance change layer,
   at least part of the second interconnection layer protruding to the first interconnection layer side in a cross section of the second interconnection layer cut perpendicularly to the second direction.

2. The device according to claim 1, wherein the metal ion source layer is provided between the resistance change layer and the metal-containing layer.

3. The device according to claim 1, wherein the cross section of the second interconnection layer is a polygon and a corner of the polygon protrudes to the first interconnection layer side.

4. The device according to claim 1, wherein at least part of the first interconnection layer protrudes to the second interconnection layer side in a cross section of the first interconnection layer cut perpendicularly to the first direction.

5. The device according to claim 4, wherein the cross section of the first interconnection layer is a polygon and a corner of the polygon protrudes to the second interconnection layer side.

6. The device according to claim 2, wherein a portion of the second interconnection layer protruding to the first interconnection layer side is the metal ion source layer.

7. The device according to claim 4, wherein a distance between a portion of the first interconnection layer protruding to the second interconnection layer side and a portion of the second interconnection layer protruding to the first interconnection layer side form a shortest distance via the resistance change layer in a position where the first interconnection layer and the second interconnection layer cross each other.

8. The device according to claim 1, further comprising a current limitation layer in a position where the first interconnection layer and the second interconnection layer cross each other.

9. A nonvolatile memory device comprising:
   a first interconnection layer extending in a first direction;
   a second interconnection layer extending in a second direction crossing the first direction, and the second interconnection layer including a metal-containing layer and a metal ion source layer;
   a first resistance change layer provided in a position where the second interconnection layer and the first interconnection layer cross each other, and a metal ion released from the metal ion source layer being capable to be diffused into the first resistance change layer;
   a third interconnection layer crossing the second interconnection layer, the third interconnection layer extending in the first direction, and the third interconnection layer being provided on an opposite side to the first interconnection layer; and
   a second resistance change layer provided in a position where the second interconnection layer and the third interconnection layer cross each other, and a metal ion released from the metal ion source layer being capable to be diffused into the second resistance change layer,
   the second interconnection layer including the metal ion source layer on the first interconnection layer side and on the third interconnection layer side,
   at least parts of the second interconnection layer protruding to the first interconnection layer side and to the third interconnection layer side in a cross section of the second interconnection layer cut perpendicularly to the second direction.

10. The device according to claim 9, wherein the metal ion source layer is provided between the first resistance change layer and the metal-containing layer and provided between the second resistance change layer and the metal-containing layer.

11. The device according to claim 9, wherein the cross section of the second interconnection layer is a polygon and corners of the polygon protrude to the first interconnection layer side and to the third interconnection layer side.

12. The device according to claim 9, wherein at least part of the first interconnection layer protrudes to the second interconnection layer side in a cross section of the first interconnection layer cut perpendicularly to the first direction.

13. The device according to claim 12, wherein the cross section of the first interconnection layer is a polygon and a corner of the polygon protrudes to the second interconnection layer side.

14. The device according to claim 12, wherein at least part of the third interconnection layer protrudes to the second interconnection layer side in a cross section of the third interconnection layer cut perpendicularly to the first direction.

15. The device according to claim 14, wherein the cross section of the third interconnection layer is a polygon and a corner of the polygon protrudes to the second interconnection layer side.

16. The device according to claim 9, wherein portions of the second interconnection layer protruding to the first interconnection layer side and to the third interconnection layer side are the metal ion source layer.

17. The device according to claim 9, wherein
   a distance between a portion of the first interconnection layer protruding to the second interconnection layer side and a portion of the second interconnection layer protruding to the first interconnection layer side form a shortest distance via the first resistance change layer in a position where the first interconnection layer and the second interconnection layer cross each other, and a distance between a portion of the third interconnection layer protruding to the second interconnection layer side and a portion of the second interconnection layer protruding to the third interconnection layer side form a shortest distance via the second resistance change layer in a position where the third interconnection layer and the second interconnection layer cross each other.

18. The device according to claim 9, wherein a current limitation layer is provided in a position where the first interconnection layer and the second interconnection layer cross each other and provided in a position where the third interconnection layer and the second interconnection layer cross each other.

* * * * *